United States Patent
Rathi et al.

(10) Patent No.: US 8,764,458 B1
(45) Date of Patent: Jul. 1, 2014

(54) SPRING CONNECTOR AND CORRESPONDING GUIDE ELEMENT

(75) Inventors: Nidhi Rathi, Sunnyvale, CA (US); Edward A. Liljegren, San Francisco, CA (US)

(73) Assignee: Amazon Technologies, Inc., Reno, NV (US)

( * ) Notice: Subject to any disclaimer, the term of this patent is extended or adjusted under 35 U.S.C. 154(b) by 2 days.

(21) Appl. No.: 13/609,131

(22) Filed: Sep. 10, 2012

(51) Int. Cl.
*H01R 12/00* (2006.01)

(52) U.S. Cl.
USPC ............................................. 439/66; 439/700

(58) Field of Classification Search
USPC ........................................... 439/66, 700, 824
See application file for complete search history.

(56) References Cited

U.S. PATENT DOCUMENTS

| | | | | |
|---|---|---|---|---|
| 4,966,556 A * | 10/1990 | Reymond et al. | | 439/80 |
| 6,036,503 A * | 3/2000 | Tsuchida | | 439/70 |
| 6,814,626 B2 * | 11/2004 | Wen-Yao | | 439/700 |
| 6,909,056 B2 * | 6/2005 | Vinther | | 174/260 |
| 7,147,478 B1 * | 12/2006 | Ju | | 439/66 |
| 7,322,830 B2 * | 1/2008 | Szu | | 439/66 |
| 7,404,717 B2 * | 7/2008 | Kazama | | 439/66 |
| 8,373,430 B1 * | 2/2013 | Sochor | | 324/755.05 |
| 2005/0037636 A1 * | 2/2005 | Lan | | 439/66 |
| 2007/0105407 A1 * | 5/2007 | Dwan et al. | | 439/66 |
| 2008/0003888 A1 * | 1/2008 | Xu | | 439/700 |
| 2009/0111289 A1 * | 4/2009 | Vinther | | 439/66 |
| 2010/0075513 A1 * | 3/2010 | Maughan et al. | | 439/66 |

* cited by examiner

*Primary Examiner* — Gary Paumen
(74) *Attorney, Agent, or Firm* — Lowenstein Sandler LLP

(57) ABSTRACT

An electronic device including housing having a channel through the housing and a spring loaded connector within the housing is described. The spring loaded connector includes a head disposed in the housing and a surface of the head mates with a surface of the channel.

20 Claims, 12 Drawing Sheets

SPRING CONNECTOR AND CORRESPONDING GUIDE ELEMENT

BACKGROUND OF THE INVENTION

A large and growing population of users enjoy entertainment through the consumption of digital media items, such as music, movies, images, electronic books, and so on. Users employ various electronic devices to consume such media items. Among these electronic devices are electronic book readers, cellular telephones, personal digital assistants (PDAs), portable media players, tablet computers, netbooks, and the like.

These electronic devices often use include connectors used to couple electrical components of the electronic device. Positioning these connectors during manufacture of the electronic device can be difficult.

BRIEF DESCRIPTION OF THE DRAWINGS

The present invention will be understood more fully from the detailed description given below and from the accompanying drawings of various embodiments of the present invention, which, however, should not be taken to limit the present invention to the specific embodiments, but are for explanation and understanding only. Further, it should be understood that the drawings are not necessarily proportional or to scale.

DETAILED DESCRIPTION OF THE PRESENT INVENTION

A connector, also referred to as a contact, may be used to electrically couple a component of an electronic device to an external source. For example, a connector may be used to couple a battery of an electronic device to a power source. As another example, a connector may be used to couple an interface of an electronic device to a data source. During manufacture, sizing and placing the connector can be difficult. The connector may be sized and positioned such that it is exposed through a housing of the electronic device and able to couple with external sources, but such that it does not extend too far outside the housing the electronic device where it may be damaged or disrupt the aesthetics of the device.

In one embodiment, the connector is a spring loaded connector that mates with the housing. The spring loaded connector includes a spring and the size of the connector can be decreased by compressing the spring. By mating the spring loaded connector with the housing, the spring is compressed during manufacture so that the connector is properly sized. In one embodiment, the housing further includes a channel that guides the connector such that the connector is properly positioned.

In one embodiment, an electronic device includes a partially exposed spring loaded connector. In particular, the spring loaded connector is at least partially disposed within a housing of the electronic device. The housing includes a channel through the housing with a channel surface that matches a corresponding surface of a portion of the spring loaded connector. The channel is of a first diameter at the exposure site of the spring loaded connector, but abruptly increases in size internally to a second diameter, and further increases in size gradually towards the interior of the device, thereby defining angled sides of the channel.

Figure 1:
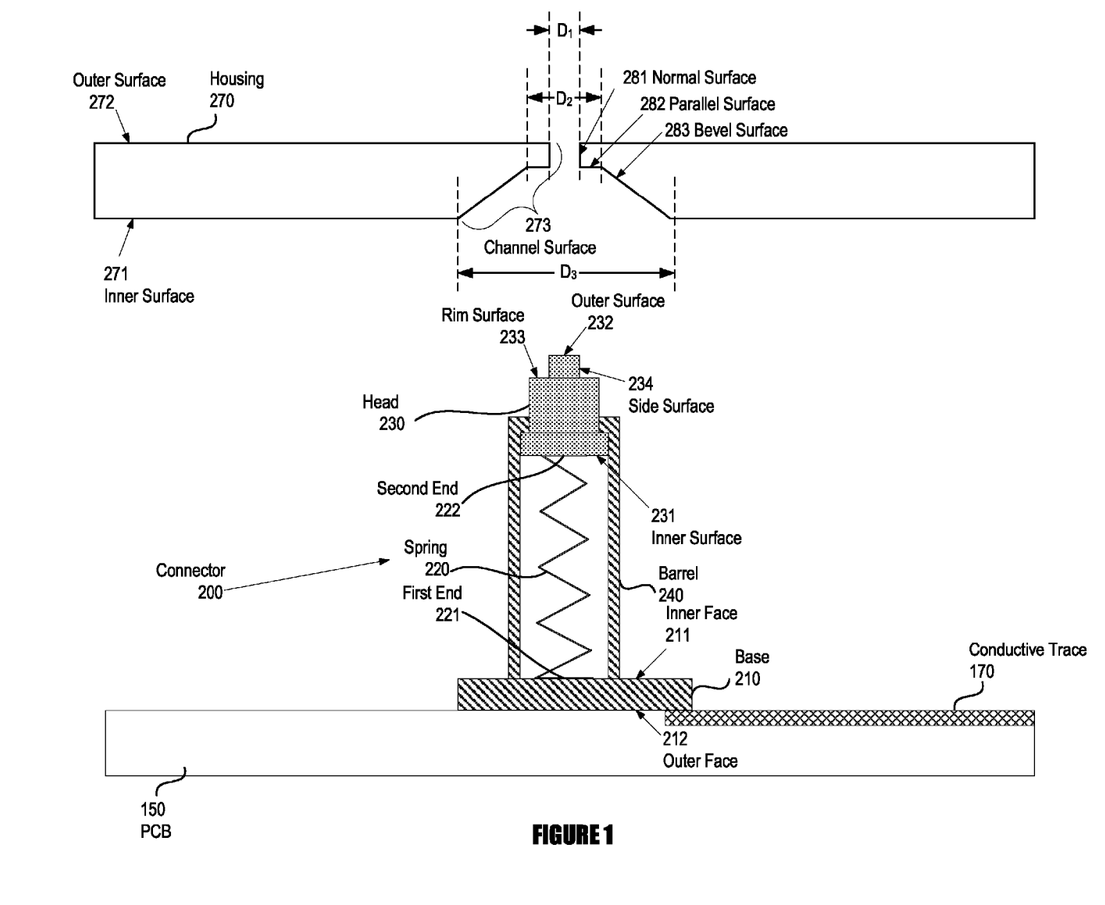
FIG. 1 illustrates a cross-sectional view of an embodiment of a connector prior to positioning within a housing.

FIG. 1 illustrates a cross-sectional view of an embodiment of a connector 200 prior to positioning within a housing 270. The housing includes a channel surface 273 that mates with a corresponding surface of the connector 200. In particular, the rim surface 233 of the head 230 of the connector 200 mates with the parallel surface 282 of the housing. When the connector 200 is moved towards the housing 270, the rim surface 233 contacts the parallel surface 282 and prevents the connector 200 from extending beyond the housing 270. As the connector 200 is moved further towards the housing 270, the spring 220 compresses, ensuring that the connector 200 is properly sized. Further, the channel surface 273 includes a bevel surface 283 that laterally guides the connector 200 as the connector 200 is moved towards the housing 270 and centers the connector 200, ensuring that the connector 200 is properly positioned.

Figure 2:
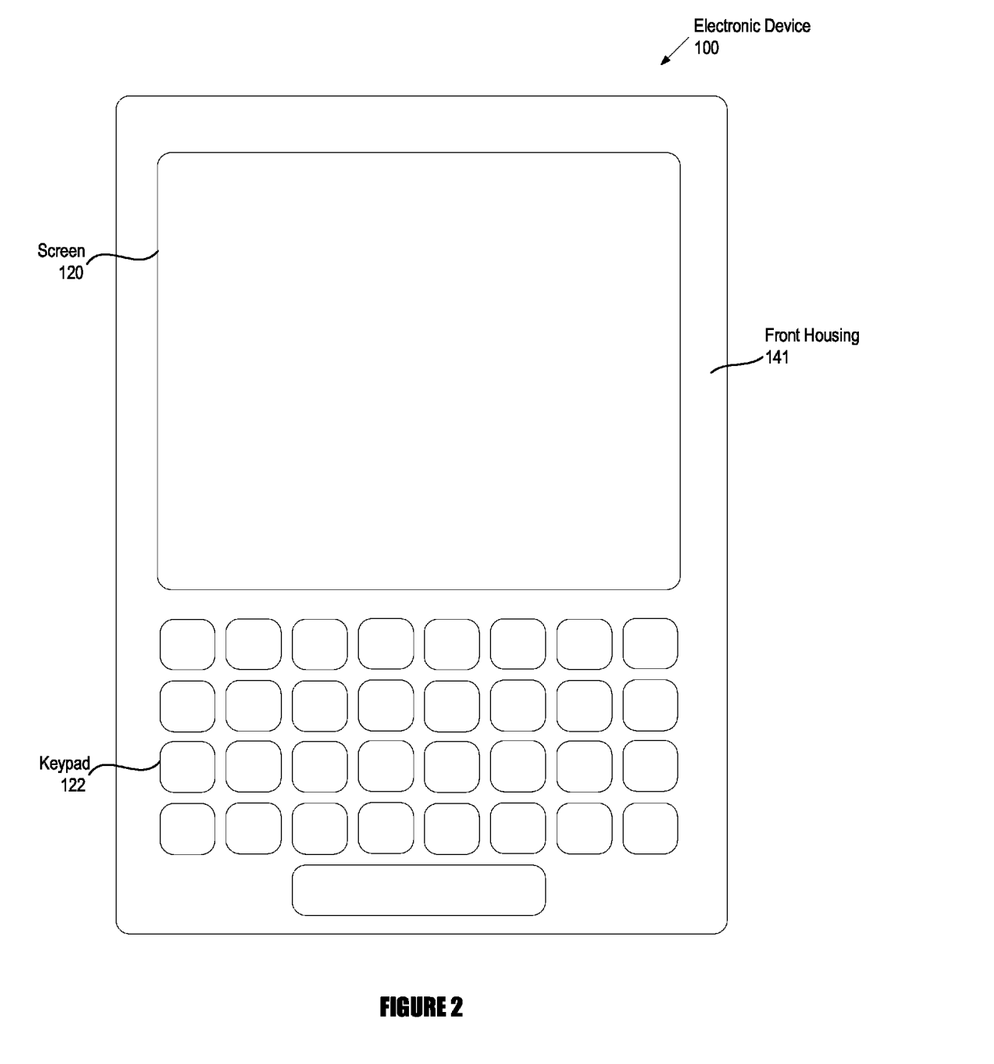
FIG. 2 illustrates a front view of an embodiment of an electronic device.
Figure 3:
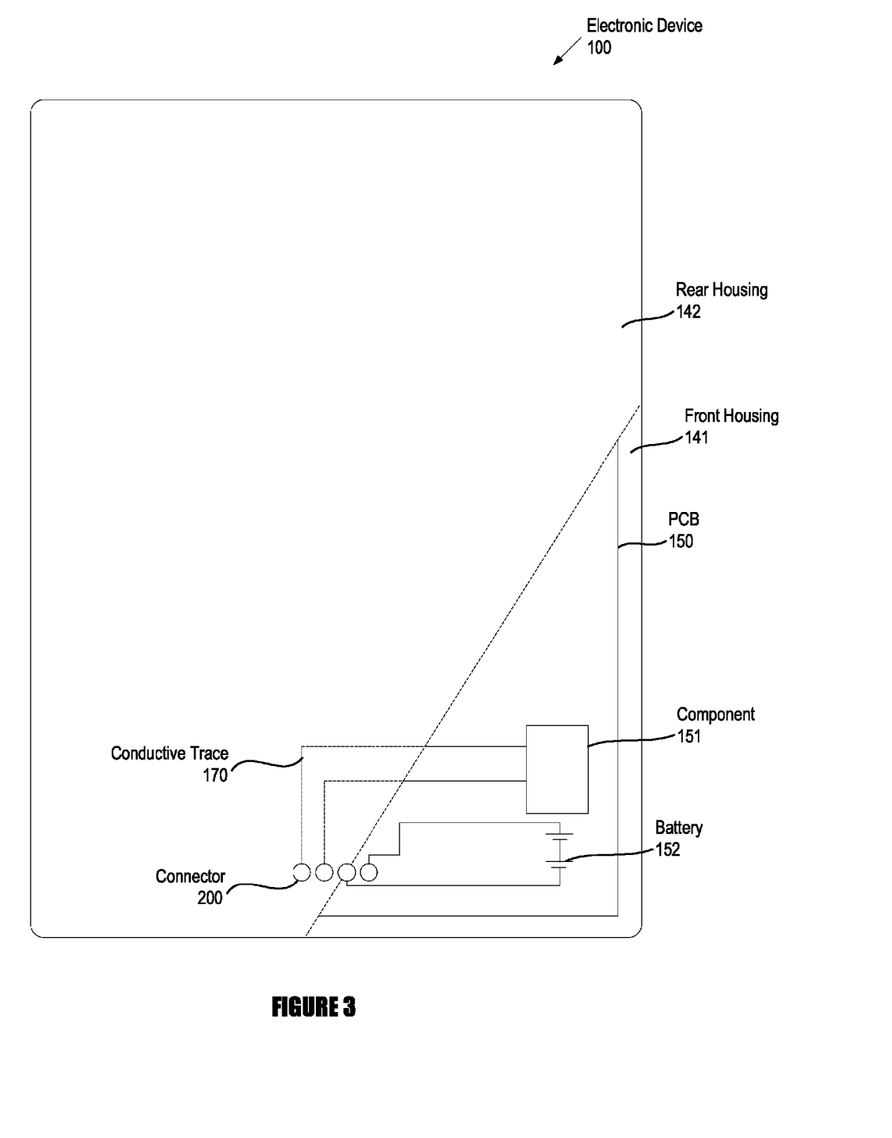
FIG. 3 illustrates a partially cutaway back view of the electronic device.

As noted above, the connector 200 may be used to couple components of an electronic device to an external source. FIG. 2 illustrates a front view of an embodiment of an electronic device 100. FIG. 3 illustrates a partially cutaway back view of the electronic device 100. The electronic device 100 may include an electronic book reader, a cellular telephone, a personal digital assistant (PDAs), a portable media player, a tablet computer, a netbook, or any portable, compact electronic device.

The electronic device 100 includes a screen 120 which can display text, images, or other media. In particular, the screen 120 may comprise a liquid crystal display (LCD), an electrophoretic ink (E ink) screen, an interferometric modulator (IMod) screen, or any another type of display. The screen 120 may include a plurality of pixels arranged in a grid having parameters that are individually configurable by the electronic device. For example, the electronic device 100 may be configured to configure the color and/or brightness of individual pixels so as to display an image, text, or other media.

The electronic device 100 includes a front housing 141 which partially surrounds and protects the internal components of the electronic device 100, such as those described below with respect to FIG. 10. The front housing 141 includes openings through which output devices, such as the screen 120 can transmit information to a user and through which input devices, such as the keypad 122, can receive information from a user. In one embodiment, the front housing 141 is composed of plastic. In other embodiments, the front housing 141 is composed of other materials.

The electronic device 100 includes a rear housing 142 opposite the front housing 141 which partially surrounds and protects the internal components of the electronic device 100. In one embodiment, the rear housing 142 is coupled to the front housing 141 to create a housing for the electronic device 100. Although the front housing 141 and rear housing 142 are described as separate components, it is to be appreciated that the housing may be formed as a single component or as more than two components.

The housing surrounds a printed circuit board (PCB) 150 of the electronic device 100. The PCB 150 may have one or more electrical components 151 attached thereto, including, for example, a resistor, a switch, a circuit, a chip, a processing device, or a storage device. In one embodiment, the electrical components 151 may include one or more conductive traces 170 that couple various other components of the PCB 150. Alternatively, other components not described above may be attached to the PCB 150.

Although embodiments are described herein with respect to a printed circuit board (PCB) 150 as a support structure, it is to be appreciated that other embodiments may involve other support structures, such a logic board, a motherboard, an analog board, a substrate, or a frame, such as an internal frame or a midframe. The support structure may be composed of metal, plastic, or a combination of metal and plastic. In other embodiments, the support structure may be other types or composed of other materials.

The electronic device 100 includes a rechargeable battery 152 for storing energy that is used to power the electronic device 100. In one embodiment, the battery 152 is attached the PCB 150. However, in other embodiments, the battery 152 is not attached to the PCB 150.

The electronic device 100 further includes one or more connectors 200 that are attached to the PCB 150 and electrically coupled to a portion of the electronic device 100. The connectors 200 may be coupled, for example, to a conductive trace 170, the battery 152, or another component 151. The connectors may be coupled, via a conductive trace 170, to a component 151, such as the battery 152.

The connectors 200 are exposed by openings in the rear housing 142. In other embodiments, the connectors 200 are exposed by openings in the front housing 141 or in a side housing, or through an opening between the front housing 141 and the rear housing 142. The connectors 200 may be otherwise exposed. This allows electrical access to components 151 through the housing. For example, a data cable could be electrically connected to the connectors 200 to provide information to or read information from the component 151. As another example, a power source could be electrically connected to the connectors 200 to charge the battery 152.

In one embodiment, the connectors 200 are disposed in and flush with the rear housing 142. In other embodiments, the connectors 200 protrude beyond or are recessed within the rear housing 142. The gaps between the rear housing 142 and the connectors 200 may be minimized to reduce contamination and for aesthetic purposes. However, fitting the connectors 200 in the opening in the rear housing 142 during manufacture may be difficult.

In one embodiment, the connectors 200 are spring loaded connectors. In other embodiments, the connectors 200 are other types of connectors. Spring loaded connectors, alternatively referred to as pogo pins, may advantageous maintain a connection when the device is subject to vibration, shock, or other movement, as the spring adjusts the size of the connector in response to such movement. Further, the adjustable size of a spring loaded connector simplifies manufacturing as a single component can be used to bridge gaps of various sizes between components.

Referring again to FIG. 3, the connector 200 is attached to the PCB 150 surrounded by the housing 270, which may be either the front housing 141 or the rear housing 142, and electrically coupled to the conductive trace 170. As noted above, the conductive trace 170 may be further coupled to other components of the electronic device.

The connector 200 includes an electrically conductive base 210 having an inner face 211 opposite an outer face 212. The outer face 212 abuts the conductive trace 170, thereby electrically coupling the conductive trace 170 to the connector 200. Further, the abutment electrically couples the connector to any components the conductive trace 170 is coupled to.

The connector 200 includes a spring 220 having a first end 221 and a second end 222. The first end 221 of the spring 220 abuts the inner face 211 of the base 210. The spring 220 may be any elastic object that can store mechanical energy. For example, the spring 220 may be a helical spring or a leaf spring composed of, e.g., metal. The spring 200 may be a piece of elastic material, such as rubber. In other embodiments, the spring may be a different type of spring or composed of different materials than those described above.

The connector 200 includes an electrically conductive head 230 having an inner surface 231 and an outer surface 232. The second end 222 of the spring 220 abuts the inner surface 231 of the head 230.

The connector 200 includes a barrel 240 attached to the inner face 211 of the base 210. The barrel 240 surrounds the spring 220 and prevents the head 230 from becoming detached from the connector 200. The barrel 240 surrounds the inner surface 231 of the head 230, but does not surround the outer surface 231 of the head. Beyond the barrel 240, the head 230 further includes a rim surface 233 that is substantially parallel to the outer surface 232 and further includes a side surface 234 that is substantially perpendicular to the outer surface 232. As used herein, substantially parallel includes up to five degrees from parallel and substantially perpendicular includes up to about five degrees from perpendicular. Further, although some embodiments are described as "parallel" or "perpendicular" without the qualifier "substantially", it is to be appreciated that the terms "parallel" and "perpendicular" are not exact and may similarly include up to about five degrees or more from parallel or perpendicular. Although described as a separate component, it is to be appreciated that the barrel 240 and base 210 may be integrally formed as a single piece of homogenous material.

Thus, the head 230 includes portions of two diameters beyond the barrel, the portion of a diameter defined by the outer edge of the rim surface 233 and the portion having a diameter defined by the outer edge of the outer surface 233. The diameter defined by the outer edge is greater than the diameter defined by the inner edge. As illustrated in FIG. 2, the head 230 may include a third diameter surrounded by the barrel 240 and defined by the outer edge of the inner surface 231.

The rim surface 233 and side surface 234 of the head 230 are shaped to mate with corresponding surfaces of the housing 270, thereby increasing the manufacturing tolerance as will be described below with respect to FIG. 4.

The housing 270 includes an inner surface 271, an outer surface 272, and a channel surface 273 that defines a channel between the inner surface 271 and outer surface 272 and through the housing 270. It is to be appreciated that, even though FIG. 3 is a cross-sectional view and only shows a portion of the channel surface 273, the channel surface 273 is three-dimensional and surrounds a channel through the housing. The channel may be cylindrical or square or otherwise shaped. In one embodiment, the inner surface 271 and outer surface 272 are substantially parallel. In other embodiments, the inner surface 271 and outer surface 272 are not parallel. In one embodiment, as illustrated, the inner surface 271 and outer surface 272 are planar. However, in other embodiments, the inner surface 271 and outer surface 272 may be any shape including planar, curved, rounded, ridged, ribbed, wrinkled, or textured. In other embodiments, the inner surface 271 and outer surface 270 may be shaped or oriented differently than described above.

In one embodiment, such as that illustrated in FIG. 3, the channel surface 273 includes three subsurfaces: a normal surface 281 that intersects and is perpendicular to the outer surface 272, a parallel surface 282 that intersects and is perpendicular to the normal surface 281, and a bevel surface 283 that intersects and has a bevel with respect to the parallel surface 282. In particular, the bevel surface 283 is neither parallel nor perpendicular to the inner surface 271, the outer surface 272, the normal surface 281, or the parallel surface 282. Thus, the channel surface 273 defines an opening at the outer surface 272 which has a first diameter $D_1$ is abruptly increased in diameter toward the inner surface 271 to a second diameter $D_2$ (thereby defining the parallel surface 282) then continues to gradually increase in diameter towards the inner surface 271 to as third diameter $D_3$ (thereby defining the bevel surface 283). As noted above, the bevel surface 283 is at a bevel to the parallel surface 282, thereby defining a draft angle. For example, the bevel surface 283 may be at a draft angle between 5 degrees and 85 degrees from parallel to the parallel surface 282. In particular, the bevel surface 283 may at a draft angle between 10 degrees and 80 degrees from parallel to the parallel surface 282. In one embodiment, the bevel surface 283 is 30 degrees, 45 degrees, or 60 degrees from parallel to the parallel surface 282. In other embodiments, the bevel surface 281 may be at other angles.

To position the connector 200 within the housing 270, the connector is pressed towards the housing 270 in a direction from the inner surface 271 towards to the outer surface 272 (e.g., upward in FIG. 3). Alternatively, the housing 270 may be pressed towards the connector 200 or the two otherwise moved together.

As the connector 200 and housing 270 are moved towards each other and the head inserted into the channel defined by the channel surface 273, the head 230 slides along the bevel surface 283 to center the connector 200 with respect to the channel. As the connector 200 and housing 270 are moved further towards each other and the head 230 further inserted, the side surface 234 of the head 230 is surround by (and may contact) the normal surface 281 of the housing 270. The connector 200 may be further inserted into the housing 270 until the rim surface 233 abuts the parallel surface 282 of the housing. In one embodiment, the head 230 is designed and sized such that, when the rim surface 233 abuts the parallel surface 282, the outer surface 232 of the head 230 is substantially flush with the outer surface 272 of the housing 270. This creates, as shown in FIG. 4, a flush surface 297 with the outer surface 232 of the head 230 and the outer surface 272 of the housing 270. Thus, a height of the side surface 234 is substantially the same as a depth of the normal surface 281. In other embodiments, the outer surface 232 of the head 230 may be recessed from the outer surface 272 of the housing 270 or may protrude slightly.

Figure 4:
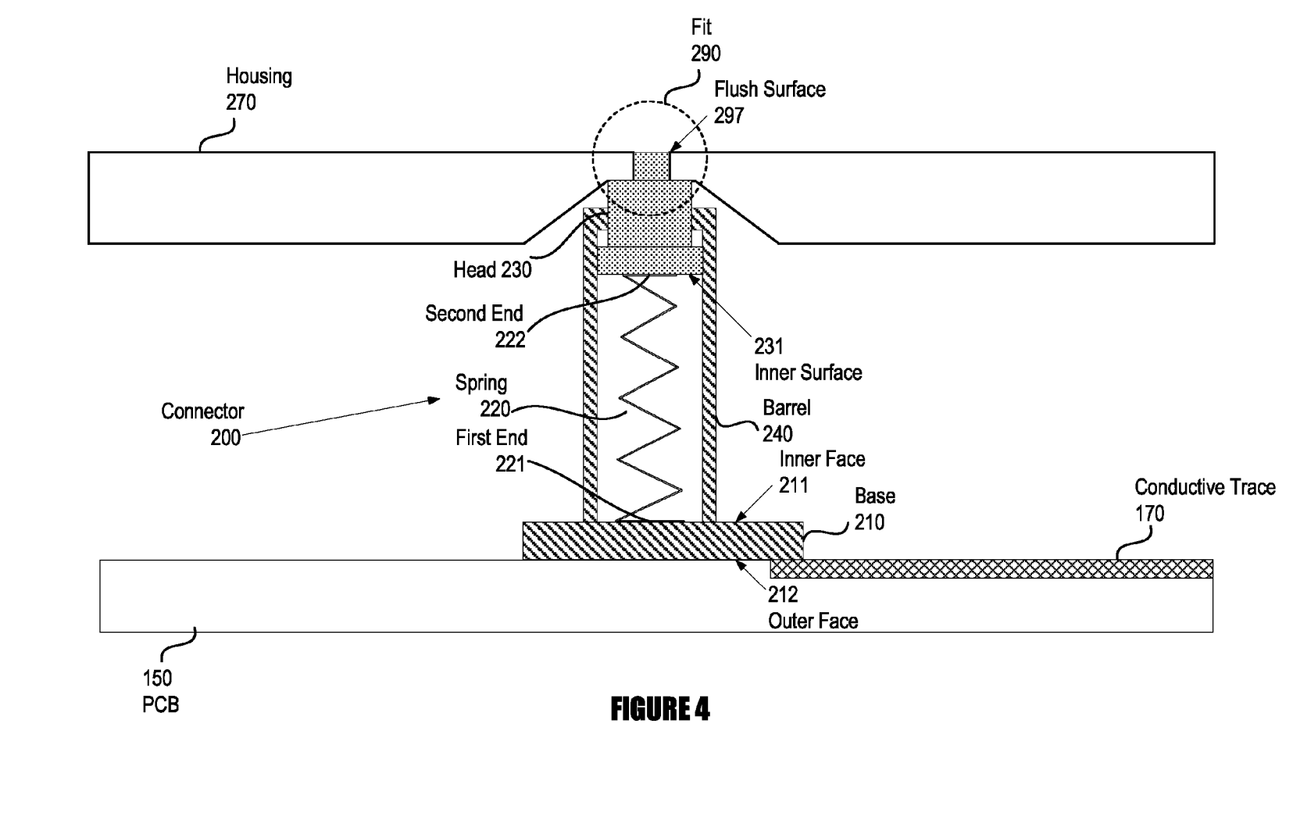
FIG. 4 illustrates a cross-sectional view of the connector disposed within the housing.

FIG. 4 illustrates a cross-sectional view of the connector 200 disposed within the housing 270. As mentioned above, once the connector 200 has been fully inserted into the housing 270, the side surface 234 of the head 230 is surrounded by the normal surface 281 of the housing 270 and the rim surface 233 of the head 230 abuts the parallel surface 282 of the housing, thereby creating a fit. In one embodiment, the side surface 234 abuts the normal surface 281 and creates an interference fit between the head 230 and the housing 270. In particular, the abutment of the side surface 234 with the normal surface 281 at least partially restricts, by friction, motion of the head 230 along the axis of insertion (e.g., upward and downward in FIG. 3). In one embodiment, the side surface 234 is squeezed by the normal surface 281 to increase this friction and to restrict motion of the head 230. In one embodiment, to side surface234 and normal surface 281 are about the same shape to maximize the abutting surface area and therefore the amount of friction and strength of the interference fit. It is to be appreciated that the presence of the normal surface 281 also restricts motion of the head in other directions.

The abutment of the rim surface 233 and the parallel surface 282 increases the manufacturing tolerance loop. As shown in FIG. 4, the abutment of the rim surface 233 and the parallel surface 282 when the connector 200 is inserted into the housing 270 pushes the head 230 further into the barrel 240. The movement of the head 230 and compression of the spring 220 absorbs some of the variability inherent in a manufacturing process and limits excess space between PCB 150 and the housing 270. Further, the spring 220 absorbs motion of components during use. For example, if the PCB 150 and the housing 270 were moved closer together through thermal expansion or compression of the device, the spring 220 would further compress, but the head 230 would remain fixed with respect to the housing 270.

As mentioned above, the base 210 and head 230 of the connector 200 are electrically conductive. In one embodiment, the base 210, head 230, or both the base 210 and the head 230 may be composed of metal. In one embodiment, the spring 220, the barrel 240, or both is also electrically conductive and electrically couples the base 210 to the head 230. For example, the spring 220, barrel 240, or both may be composed of metal. In another embodiment, the connector 200 includes an additional component to electrically couple the base 210 to the head 230. In other embodiments, the components of the connector 210 may be composed of other materials.

With the base 210 and head 230 electrically coupled, anything electrically coupled to the head 230 is also electrically coupled to the conductive trace 170 and any component the conductive trace 170 is further coupled to. For example, a data cable could be electrically connected to the head 230 to provide information to or read information from a component coupled to the conductive trace 170. As another example, a power source could be electrically connected to the head 230 to charge a battery coupled to the conductive trace 170.

As seen by the top view of the connector 200 visible in FIG. 2 and the cross-sectional view of the connector 200 in FIG. 3, the connector may be substantially cylindrical. In one embodiment, for example, the connector may exhibit radial symmetry. For example, the base 210, head 230, and/or barrel 240 may be radially symmetric. As mentioned above, the spring 220 may be a helical spring. In other embodiments, the connector may a non-cylindrical shape. For example, as viewed from the top, the head 230 (and in particular, the side surface 234 and corresponding normal surface 281) may be circular, triangular, square, rectangular, elliptical, or any other shape. The shape may be convex or concave. In one embodiment, the side surface 234 and corresponding normal surface 281 may be anti-symmetrical such that only one orientation of the connector 200 allows the side surface 234 and the normal surface 281 to form an interference fit. For example, the shape of the side surface 234 may include a notch, indent, or protrusion.

Figure 5:
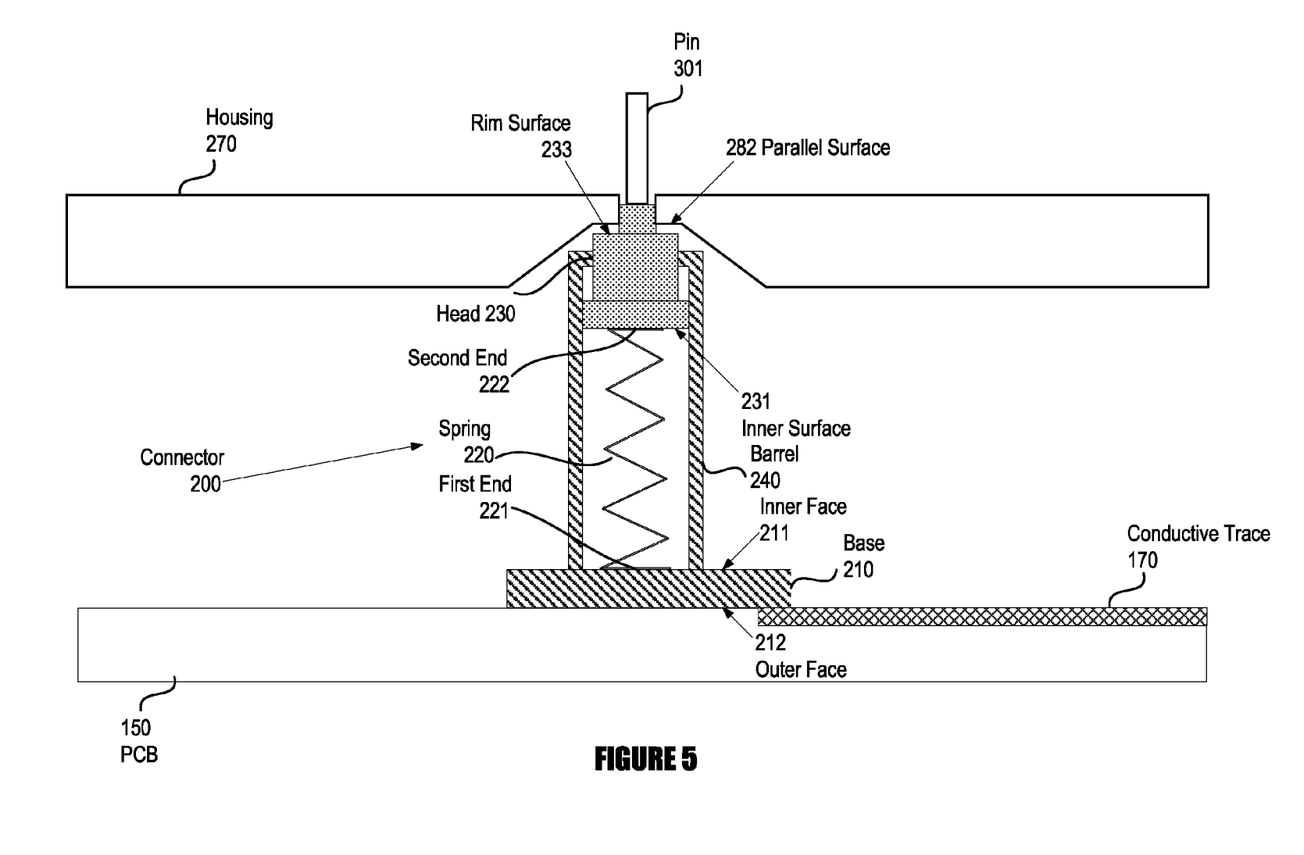
FIG. 5 illustrates a cross-sectional view of the connector in connection with a pin.

FIG. 5 illustrates a cross-sectional view of the connector 200 in connection with a pin 301. The pin 301 abuts the head 320 of the connector 200 and is, thus, in electrical connection with the conductive trace 170 via the connector 200. In one embodiment, the abutment of the pin 301 with the head 320 moves the head 230 further into the barrel 240. In one embodiment, when the pin 301 is removed, the head 230 is pushed upwards by the spring 220 until the rim surface 233 abuts the parallel surface 282.

Figure 6:
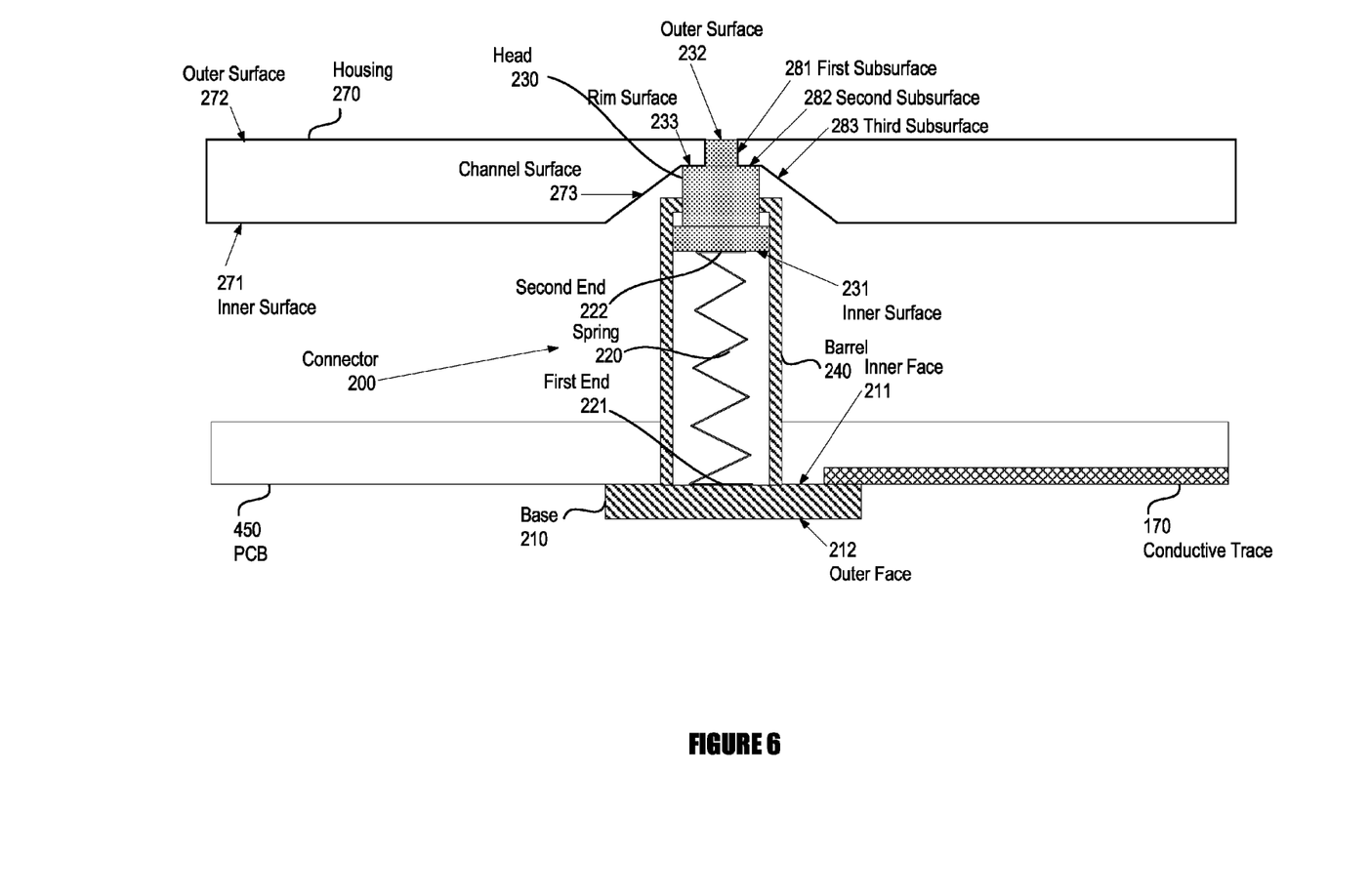
FIG. 6 illustrates a cross-sectional view of an alternate arrangement of the connector disposed within the housing.

FIG. 6 illustrates a cross-sectional view of an alternate arrangement of the connector disposed within the housing. The arrangement of FIG. 6 is substantially similar to that of FIG. 4; however, in the arrangement of FIG. 6, the connector 200 passes through the PCB 450, which includes a conductive trace 170 on the opposite side as compared to the positioning of the conductive trace 170 in FIG. 4. Because of this different positioning, the base 210 of the connector 200 contacts the conductive trace 170 via the inner face 211 rather than the outer face 212 as in FIG. 4.

Figure 7:
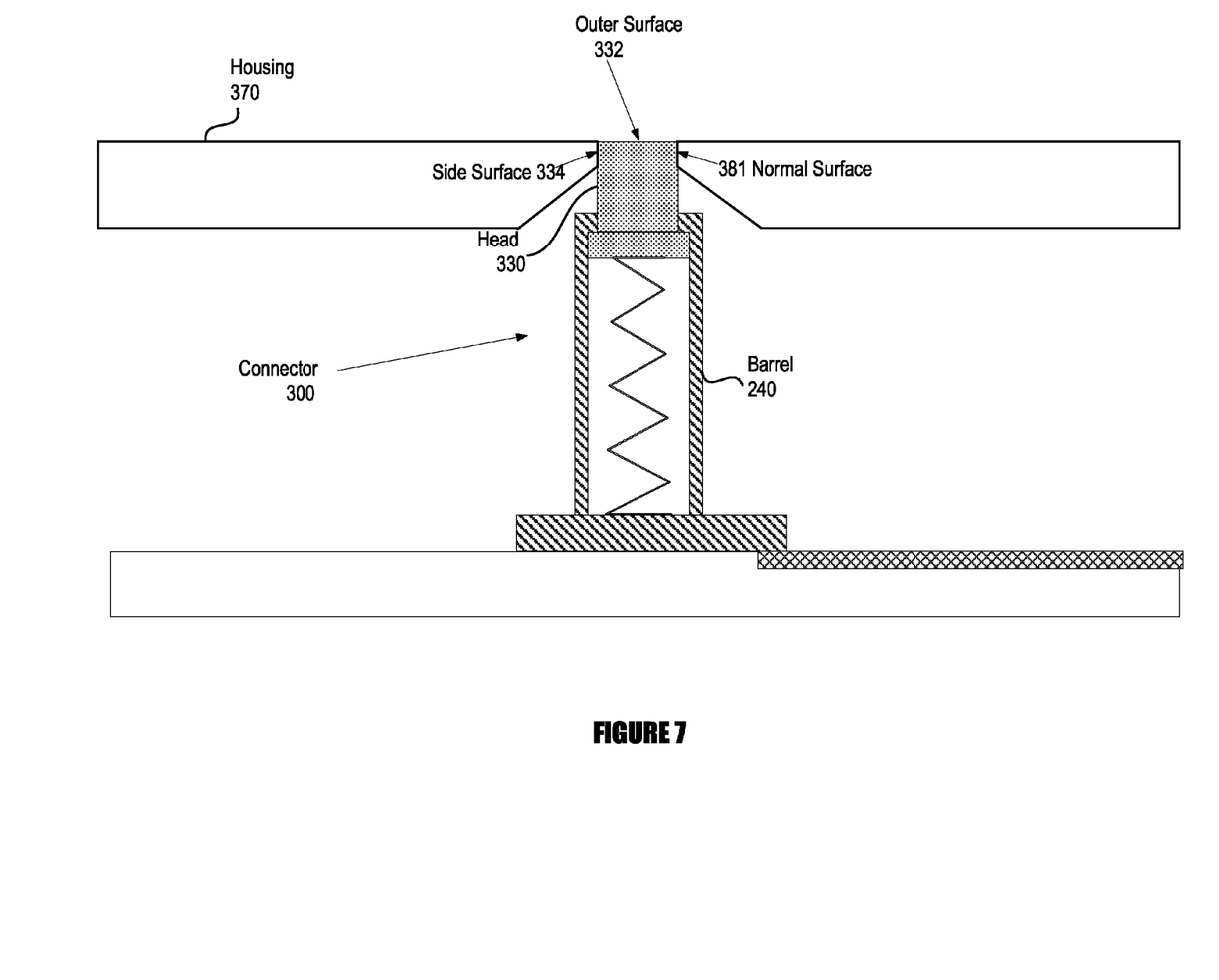
FIG. 7 illustrates a cross-sectional view of an embodiment of a connector disposed within a housing with an alternative channel embodiment.

FIG. 7 illustrates a cross-sectional view of another embodiment of a connector 300 disposed within a housing 370. The connector 300 of FIG. 7 is substantially similar to the connector 200 of FIG. 3; however, the head 330 of the connector 300 of FIG. 7 includes only one diameter beyond the barrel 240. In particular, the head 330 does not have a rim surface 233 such as the connector 200 of FIG. 3. Nevertheless, the head 330 has a side surface 334 that, in conjunction with a normal surface 381 of the housing 370, forms an interference fit.

Figure 8:
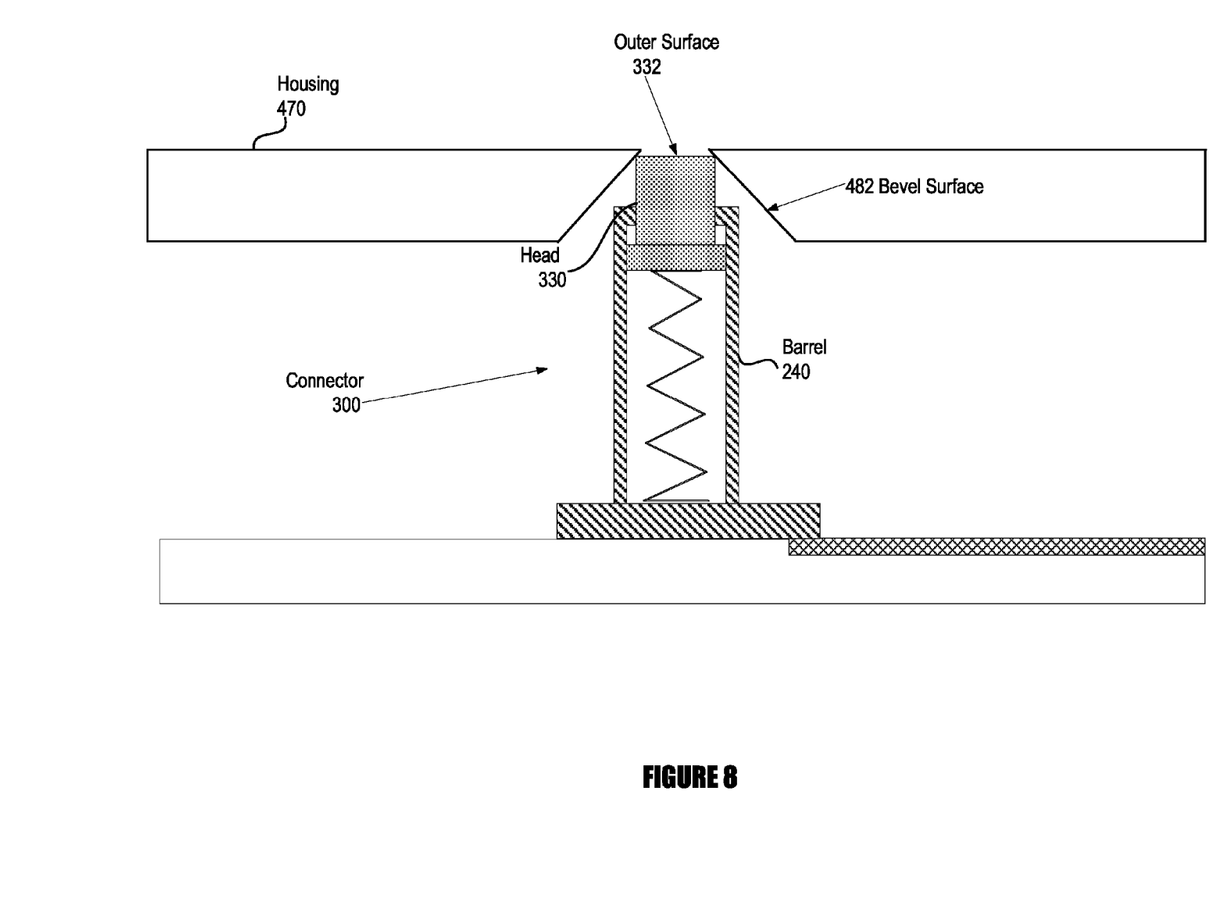
FIG. 8 illustrates a cross-sectional view of an embodiment of a connector disposed within a housing with a planar channel surface.

FIG. 8 illustrates a cross-sectional view of the connector 300 of FIG. 7 disposed within an alternate housing 470. The housing 470 of FIG. 8 is substantially similar to the housing 370 of FIG. 7; however, the housing 470 of FIG. 8 does not have a significant normal surface or parallel surface. Nevertheless, the housing 470 has a bevel surface 482 that centers the connector with respect to the channel during manufacture. In one embodiment, an interference fit is formed where the outer edge of the outer surface 332 of the head 330 presses into the housing 470. In another embodiment, no interference fit is formed. In one embodiment, the outer edge of the outer surface 332 of the head 330 presses into the housing 470, compressing the spring 220 and absorbing manufacturing variance. Thus, the channel through the housing 470 is defined by a planar bevel surface 482.

Figure 9:
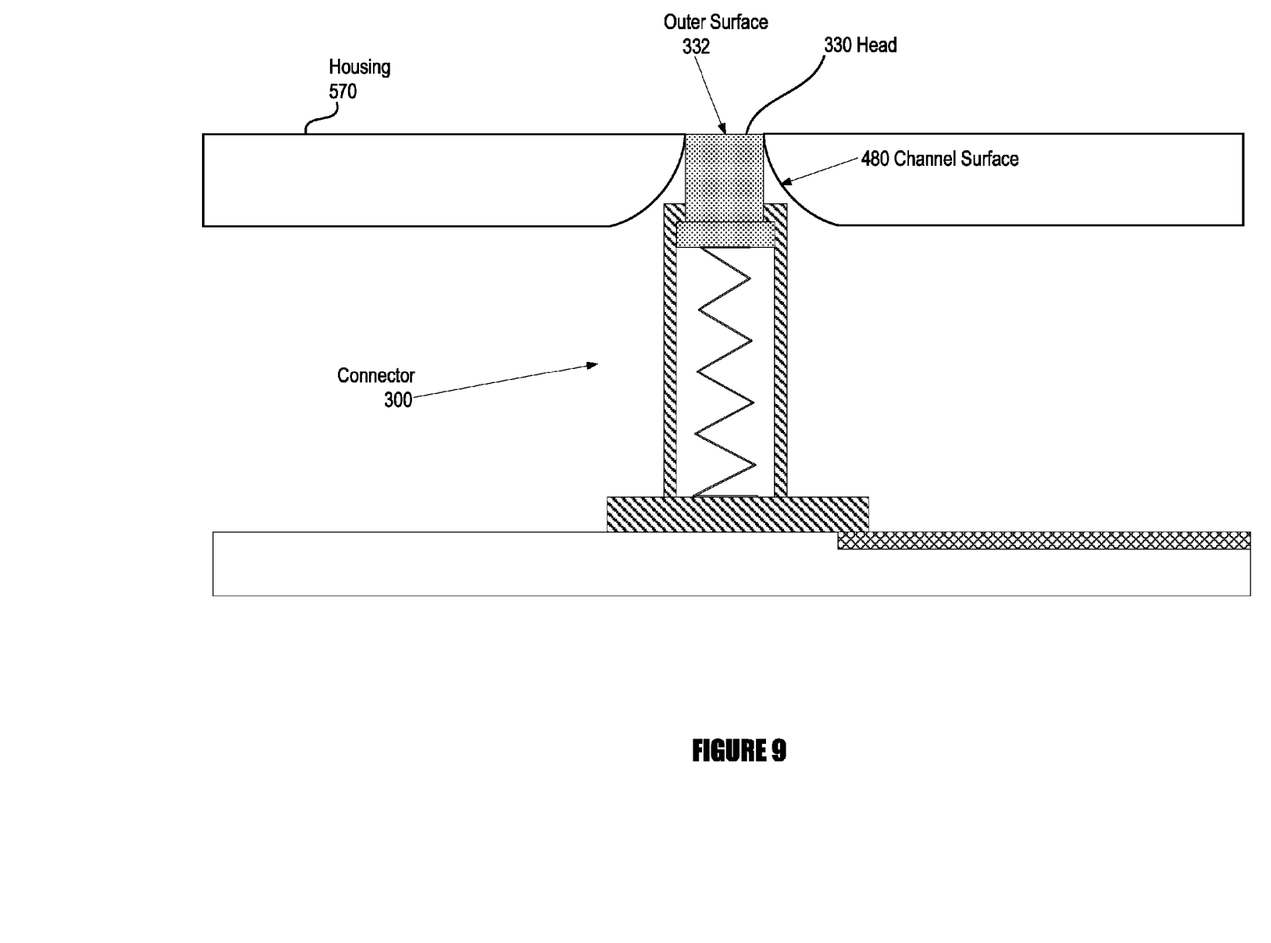
FIG. 9 illustrates a cross-sectional view of an embodiment of a connector disposed within a housing with a curved channel surface.

FIG. 9 illustrates a cross-sectional view of the connector 300 of FIG. 7 disposed within an alternate housing 570. The housing 570 of FIG. 9 is substantially similar to the housing 470 of FIG. 8; however, the housing 570 of FIG. 9 has a curved channel surface 480. In general, the channel surface 480 may be any shape including planar, curved, rounded, ridged, ribbed, wrinkled, or textured. The channel surface 480 may be entirely planar or may include more than one non-coplanar subsurface. The channel surface 480 may be concave or convex. In other embodiments, the channel surface 480 may be shaped or oriented differently than described above.

Figure 10:
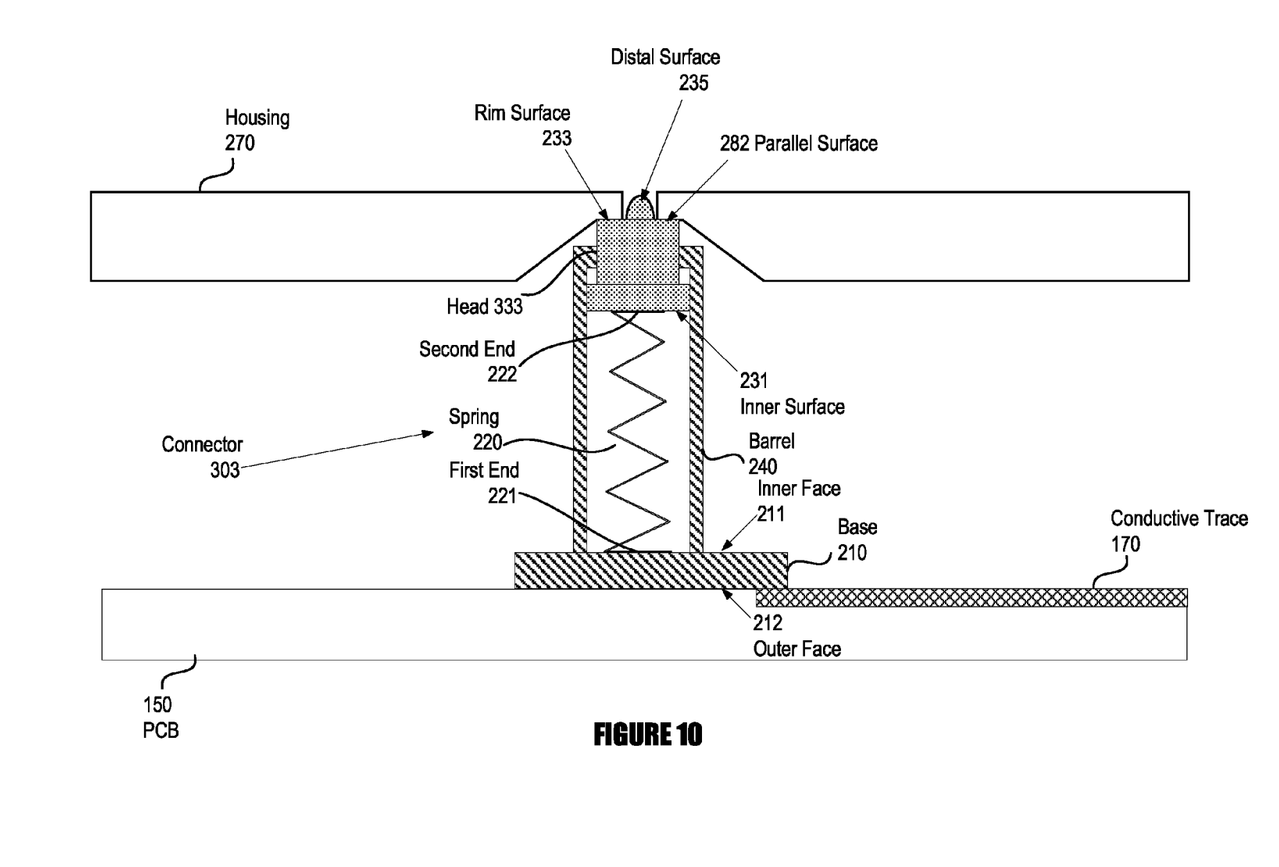
FIG. 10 illustrates a cross-sectional view of an embodiment of a connector having an alternative head protrusion.

FIG. 10 illustrates a cross-sectional view of another embodiment of a connector 303 disposed within a housing 270. The connector 303 of FIG. 10 is substantially similar to the connector 200 of FIG. 3; however, the head 333 of the connector 303 of FIG. 10 includes a different protrusion beyond the rim surface 233. In particular, the side surface and outer surface of the connector 200 of FIG. 3 are replaced by a distal surface 235. The distal surface does not match with a normal surface of the housing. Further, the distal surface of the head 333 is not flush with the outer surface of the housing 270. Nevertheless, the head 333 has a rim surface 233 that abuts the parallel surface 282 of the housing, thereby compressing the spring 220 and absorbing manufacturing variance.

Figure 11:
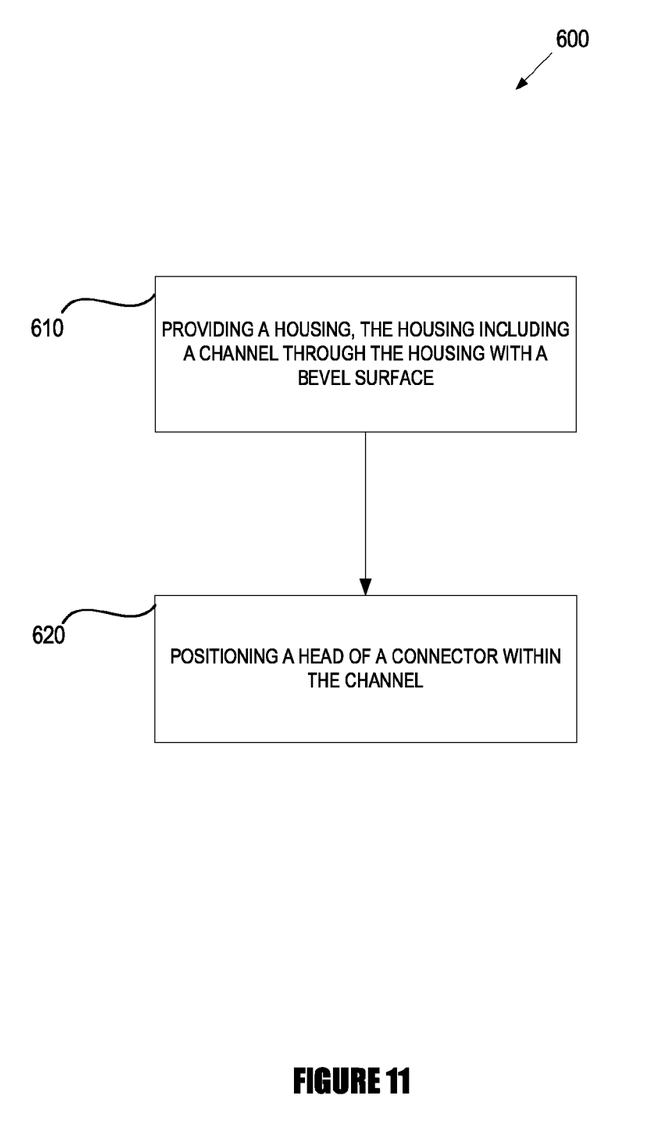
FIG. 11 illustrates a flowchart of a method of positioning a connector.

FIG. 11 illustrates a flowchart of a method 600 of positioning a connector. The method 600 begins, in block 610, by providing a connector with a housing. The housing may be, for example, the front housing 141 or rear housing 142 of the electronic device of FIG. 1. The housing may be, for example, the housing 270 of FIG. 3, the housing 370 of FIG. 7, the housing 470 of FIG. 8, or the housing 480 of FIG. 9. The housing, in one embodiment, is composed at least partially of plastic. In other embodiments, the housing is composed of other materials. The housing includes a channel through the housing with a bevel surface. In one embodiment, the housing includes an inner surface, an outer surface, and a channel surface defining a channel. The bevel surface may be part of the channel surface and may be beveled with respect to the inner surface.

In block 630, a head of a connector is positioned within the channel. The connector may be, for example, a spring loaded connector. The connector may be, for example, the connector 200 of FIG. 3, the connector 300 of FIG. 7, or the connector 303 of FIG. 10. In one embodiment, positioning the head includes inserting the head into the channel. In one embodiment, positioning the head includes sliding the head along a portion of the bevel surface. For example, the bevel surface may center the head with respect to the channel or otherwise guide the head into a proper placement.

In one embodiment, the head is positioned such that an outer surface of the head is flush with the outer surface of the housing. In one embodiment, positioning the head includes pushing the head into the channel until a rim surface of the head is pressed against a parallel surface of the channel surface. In one embodiment, positioning the head includes further pushing the connector towards the housing once the rim surface of the head is pressed against the parallel surface of the channel surface to compress a spring of the connector. In one embodiment, positioning the head includes positioning the head so a side surface of the head and a normal surface of the channel surface create an interference fit.

The head may be positioned so the connector is electrically coupled to a component attached to a printed circuit board. The method 800 may further include electrically coupling a component spaced apart from the printed circuit board to the head, thereby electrically coupling the component attached to the printed circuit board to the component space apart from the printed circuit board. Thus, via the connector, a power source may be coupled to a battery or a data cable may be coupled to a processing device or a memory.

Figure 12:
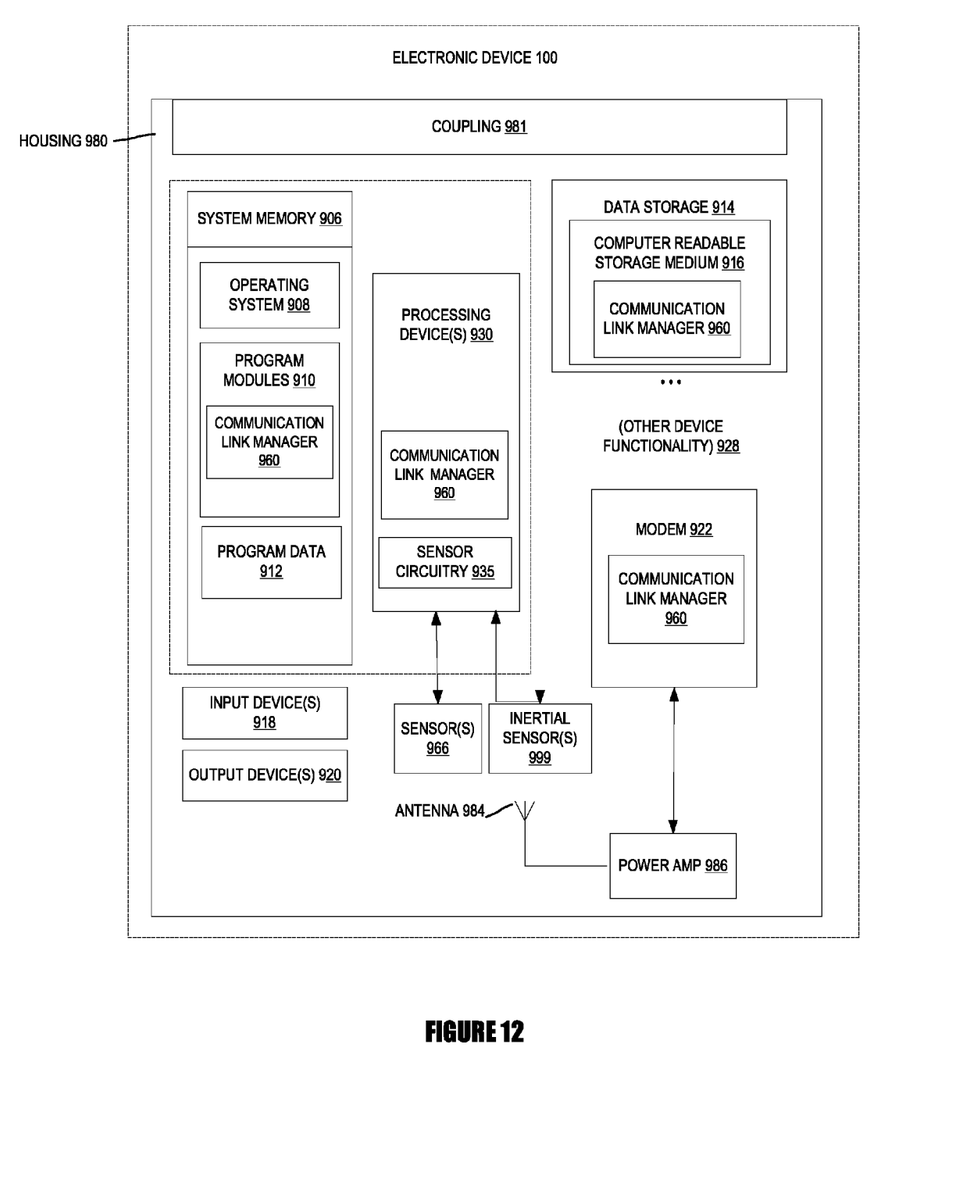
FIG. 12 illustrates a functional block diagram of an embodiment of an electronic device.

FIG. 12 illustrates a functional block diagram of an embodiment of an electronic device. The electronic device 900 may correspond to the electronic device 100 of FIG. 1 and may be any type of computing device such as an electronic book reader, a PDA, a mobile phone, a laptop computer, a portable media player, a tablet computer, a smart phone, a camera, a video camera, a netbook, a desktop computer, a gaming console, a digital video disc (DVD) player, a computing pad, a media center, and the like.

The electronic device 900 includes one or more processing devices 930, such as one or more central processing units (CPUs), microcontrollers, field programmable gate arrays, or other types of processing devices. The electronic device 900 also includes system memory 906, which may correspond to any combination of volatile and/or non-volatile storage mechanisms. The system memory 906 may include one or more of read-only memory (ROM), flash memory, dynamic random access memory (DRAM) such as synchronous DRAM (SDRAM)), and static random access memory (SRAM)). The system memory 906 stores information which provides an operating system component 908, various program modules 910 such as communication link manager 960, program data 912, and/or other components. The electronic device 900 performs functions by using the processing device(s) 930 to execute instructions provided by the system memory 906.

The electronic device 900 also includes a data storage device 914 that may be composed of one or more types of removable storage and/or one or more types of non-removable storage. The data storage device 914 includes a computer-readable storage medium 916 on which is stored one or more sets of instructions embodying any one or more of the methodologies or functions described herein. As shown, instructions for the communication link manager 960 may reside, completely or at least partially, within the computer readable storage medium 916, system memory 906 and/or within the processing device(s) 930 during execution thereof by the electronic device 900, the system memory 906 and the processing device(s) 930 also constituting computer-readable media. The electronic device 900 may also include one or more input devices 918 (keyboard, mouse device, specialized selection keys, etc.) and one or more output devices 920 (displays, printers, audio output mechanisms, etc.). In one embodiment, the input devices 918 and the output devices 920 may be combined into a single device (e.g., a touch screen).

The electronic device 900 further includes a wireless modem 922 to allow the electronic device 900 to wirelessly communicate with other computing devices. The wireless modem 922 allows the electronic device 900 to handle both voice and non-voice communications (such as communications for text messages, multimedia messages, media downloads, web browsing, etc.). The wireless modem 922 may also allow the electronic device 900 to handle other signaling data to facilitate communication of the voice and non-voice data between the electronic device 900 and other devices. The wireless modem 922 may provide network connectivity using any type of mobile network technology including, for example, cellular digital packet data (CDPD), general packet radio service (GPRS), enhanced data rates for global evolution (EDGE), universal mobile telecommunications system (UMTS), 1 times radio transmission technology (1xRTT), evaluation data optimized (EVDO), high-speed down-link packet access (HSDPA), WiFi, HSPA+, WiMAX, Long Term Evolution (LTE) and LTE Advanced (sometimes generally referred to as 4G), etc. In one embodiment, the wireless modem includes the communication link manager 960 in addition to, or instead of, the communication link manager 960 being included in the computer readable storage medium 916, system memory 906 and/or processing device(s) 930. The communication link manager 960 may be implemented as hardware, firmware and/or software of the wireless modem 922. It should be noted that the modem 922 may include a processing component that performs various operations to handle both voice and non-voice communications. This processing component can execute the communication link manager 960. Alternatively, the communication link manager 960 can be executed by a processing component of the electronic device, such as the processing device 930.

The wireless modem 922 may generate signals and send these signals to power amplifier (amp) 980 for amplification, after which they are wirelessly transmitted via antenna 984. The antenna 984 may be directional, omni-directional or non-directional antennas. In addition to sending data, the antenna 984 can be deployed to receive data, which is sent to wireless modem 922 and transferred to processing device(s) 930. In one embodiment, the antenna 984 may be used to form communication links between the electronic device 900 and a base station (e.g., a NodeB or a cell tower).

The processing device(s) 930 and the modem 922 may be a general-purpose processing devices such as a microprocessor, central processing unit, or the like. More particularly, the processing device(s) 930 and the modem 922 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device(s) 930 and the modem 922 may also be one or more special-purpose processing devices such as an application specific integrated circuit (ASIC), a field programmable gate array (FPGA), a digital signal processor (DSP), network processor, or the like.

In one embodiment, electronic device 900 includes one or more sensors 966 such as a physical contact sensor or close proximity sensors. The sensors 966 can detect the human body parts proximate to the electronic device, and convey information regarding the detection to processing device(s) 930. In one embodiment, the sensors 966 may be capacitive sensors that are configured to measure capacitance generated by the human body part proximate to the electronic device using any one of various techniques known in the art, for example, relaxation oscillation, a current verses voltage phase shift comparison, resistor-capacitor charge timing, capacitive bridge division, charge transfer, sigma-delta modulation, or charge-accumulation. In an alternative embodiment, the sensors 966 may also be optical (e.g., infrared) sensors that use an emitter and receiver pair to detect the presence of opaque objects. Alternatively, the sensors 966 may be inductive sensors, which include an inductive loop. When the presence of a human body part (or metal object) is brought close to the inductive sensor, an induction of the inductive loop changes, causing the human body part to be detected. Alternatively, the sensors 966 may be ultrasonic sensors that emit an ultrasonic signal and measure a time duration between when a signal is transmitted and the reflection of that signal received (a.k.a., flight response). The sensors 966 may also include other types of sensors, such as those that operate using the detection principles of resistive (e.g., analog resistive, digital resistive or residual resistive), surface acoustic wave, electromagnetic, near field imaging, or other technologies. In one embodiment, multiple different types of sensors are used. It should also be noted that the sensors 966 may be used to determine a distance between one or more of the antennas and the detected human body part. Though the detected object is described herein as a human body part, other types of objects may also be detected depending on the sensing technologies used.

In one embodiment, electronic device 900 includes one or more inertial sensors 999. The inertial sensors 999 can be used to detect motion of the electronic device 900. In one embodiment, the inertial sensors 999 detect linear accelerations (translational movement) and angular accelerations (rotational movement). The inertial sensors 999 may include accelerometers and/or gyroscopes. Gyroscopes use principals of angular momentum to detect changes in orientation (e.g., changes in pitch, roll and twist). Accelerometers measure accelerations along one or more axes (e.g., translational changes). The gyroscope and accelerometer may be separate sensors, or may be combined into a single sensor. The inertial sensors 999 in one embodiment are micro-electromechanical systems (MEMS) sensors.

In one embodiment, the motion data from the one or more inertial sensors 399 may be used to determine an orientation of the electronic device 300 to determine if a communication link criterion is satisfied (e.g., whether the electronic device 900 is in proximity to a user's body). In another embodiment, the sensor data from the one or more sensors 966 may be used to determine an orientation of the electronic device 900 for to determine if a communication link criterion is satisfied. In a further embodiment, of the motion data and the sensor data may be used to determine whether a communication link criterion is satisfied.

The processing device(s) 930 may include sensor circuitry 935 (e.g., sensor device drivers) that enables the processing device(s) 930 to interpret signals received from the sensor(s) 966 and/or inertial sensors 999. In one embodiment, the sensors 966 and/or inertial sensors 999 output fully processed signals to the processing device(s) 930. For example, the sensors 966 may output a distance, a detected/not detected signal, etc. using a single line interface or a multi-line interface. Similarly, inertial sensors 999 may output an acceleration value (e.g., in Gs). In another embodiment, the sensors 966 output, for example, positional data and/or object presence data (e.g., of a human body part) to the processing devices) 930 without first processing the data. Similarly, inertial sensors 999 may output, for example, voltage values that can be interpreted as acceleration values. In either instance, the processing device(s) 930 may use the sensor circuitry 935 to process and/or interpret the received data. If data is received from multiple sensors 966 and/or inertial sensors 999, processing the data may include averaging the data, identifying a maximum from the data, or otherwise combining the data from the multiple sensors. In one embodiment, in which the sensors 966 include a sensor array, numerous sensors, or a touch panel, processing the data includes determining where on the electronic device the human body part is located from multiple sensor readings.

The electronic device 100 includes a housing 980 that houses the various components described above. The housing includes a channel through the housing with a channel through which a connector 981 is at least partially exposed. The connector 981 may be electrically coupled to one or more of the components of the electronic device 100 described above.

The foregoing description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of embodiments of the present invention.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

It is to be understood that the above description is intended to be illustrative, and not restrictive. Many other embodiments will be apparent to those of skill in the art upon reading and understanding the above description. The scope of the present invention should, therefore, be determined with reference to the appended claims, along with the full scope of equivalents to which such claims are entitled.

What is claimed is:

1. An electronic device comprising:
   a support structure having a conductive trace disposed thereon;
   a housing at least partially surrounding the support structure and having an inner surface, an outer surface, and a channel surface defining a channel from the inner surface to the outer surface, wherein the channel surface comprises a normal surface substantially perpendicular to the inner surface, a parallel surface substantially parallel to the inner surface, and a bevel surface intersecting and sloped between the parallel surface and the inner surface to define a first diameter at the intersection with the parallel surface and a second diameter at the intersection of the inner surface, wherein the second diameter is greater than the first diameter; and
   a connector electrically coupled to the conductive trace and comprising a head having a side surface abutting the normal surface and having a rim surface abutting the parallel surface.

2. The electronic device of claim 1, wherein the channel surface and the side surface form an interference fit between the housing and the head.

3. The electronic device of claim 1, wherein the connector further comprises a spring disposed between the housing and the support structure and at least partially compressed by the rim surface abutting the parallel surface to limit excess space between the housing and the support structure.

4. The electronic device of claim 1, wherein the connector further comprises an electrically conductive base and an electrically conductive barrel surrounding the spring, wherein the head is electrically conductive and electrically coupled to the conductive trace via the electrically conductive barrel and the electrically conductive base.

5. An electronic device comprising:
   a housing having an inner surface, an outer surface, and a channel surface defining a channel from the inner surface to the outer surface, wherein the channel surface defines a first diameter at the intersection with the outer surface and a second diameter at the intersection of the inner surface, wherein the second diameter is greater than the first diameter; and
   a connector coupled to a support structure, the connector comprising a head disposed within the housing and a spring coupled to the head, the head having a distal surface substantially flush with the outer surface,
   wherein at least a portion of the channel surface is configured to laterally guide the head toward the center of the first diameter as the head of the connector travels from the inner surface toward the outer surface.

6. The electronic device of claim 5, wherein the channel surface comprises a normal surface perpendicular to the outer surface, wherein the head has a side surface that mates with the normal surface.

7. The electronic device of claim 6, wherein the side surface and the normal surface create an interference fit between the head and the housing.

8. The electronic device of claim 5, wherein the channel surface comprises a parallel surface substantially parallel to the outer surface, wherein the head has a rim surface that abuts the parallel surface.

9. The electronic device of claim 8, wherein the spring is disposed between the housing and the support structure and at least partially compressed by the abutment of the rim surface with the parallel surface to limit excess space between the housing and the support structure.

10. The electronic device of claim 5, wherein the channel surface is linear in cross-section.

11. The electronic device of claim 5, wherein the channel surface is curved in cross-section.

12. The electronic device of claim 5, wherein the connector further comprises an electrically conductive base and an electrically conductive barrel surrounding the spring, wherein the head is electrically conductive and electrically coupled to a component attached to the support structure via the electrically conductive barrel and the electrically conductive base.

13. An electronic device comprising:
- a housing having an inner surface, an outer surface, and a channel surface defining a channel from the inner surface to the outer surface, wherein the channel surface comprises a parallel surface that is substantially parallel to the inner surface; and
- a connector comprising a head disposed within the housing and a spring coupled to the head, the head having a rim surface and an distal surface, wherein the rim surface abuts the parallel surface and the distal surface is substantially flush with the outer surface or recessed from the outer surface within the housing.

14. The electronic device of claim 13, wherein the parallel surface is less than 5 degrees from parallel to the inner surface.

15. The electronic device of claim 13, wherein the channel surface comprises a bevel surface intersecting and sloped between the parallel surface and the inner surface.

16. The electronic device of claim 15, wherein the bevel surface is sloped at an angle between 30 degrees and 60 degrees.

17. The electronic device of claim 13, wherein the distal surface comprises a side surface perpendicular to the rim surface.

18. The electronic device of claim 17, wherein the side surface mates with the channel surface to form an interference fit.

19. The electronic device of claim 13, wherein the spring is disposed between the housing and a support structure and at least partially compressed by the rim surface abutting the parallel surface to limit excess space between the housing and the support structure.

20. The electronic device of claim 13, wherein the connector further comprises an electrically conductive base and an electrically conductive barrel surrounding the spring, wherein the head is electrically conductive and electrically coupled to a component attached to a support structure via the electrically conductive barrel and the electrically conductive base.

* * * * *